(12) United States Patent
Lim et al.

(10) Patent No.: US 10,554,191 B2
(45) Date of Patent: Feb. 4, 2020

(54) BULK ACOUSTIC WAVE FILTER DEVICE AND METHOD FOR MANUFACTURING THE SAME

(71) Applicant: SAMSUNG ELECTRO-MECHANICS CO., LTD., Suwon-si (KR)

(72) Inventors: Chang Hyun Lim, Suwon-si (KR); Han Tae Kim, Suwon-si (KR); Tae Hun Lee, Suwon-si (KR); Tae Kyung Lee, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 335 days.

(21) Appl. No.: 15/623,875

(22) Filed: Jun. 15, 2017

(65) Prior Publication Data
US 2018/0019725 A1    Jan. 18, 2018

(30) Foreign Application Priority Data

Jul. 14, 2016    (KR) .................. 10-2016-0089387
Nov. 28, 2016    (KR) .................. 10-2016-0159251

(51) Int. Cl.
*H03H 9/15*    (2006.01)
*H01L 41/09*    (2006.01)
(Continued)

(52) U.S. Cl.
CPC ........... *H03H 9/1007* (2013.01); *H01L 41/23* (2013.01); *H01L 41/25* (2013.01); *H01L 41/277* (2013.01);
(Continued)

(58) Field of Classification Search
CPC ........ H03H 9/1007; H03H 3/02; H03H 9/009; H03H 9/02118; H03H 9/173; H03H 9/64;
(Continued)

(56) References Cited

U.S. PATENT DOCUMENTS

2005/0218755 A1    10/2005  Song et al.
2011/0298564 A1 *  12/2011  Iwashita ................ H03H 3/02
                                                                        333/187
(Continued)

FOREIGN PATENT DOCUMENTS

JP    2009-55128 A    3/2009
JP    2010-10932 A    1/2010
(Continued)

Primary Examiner — Thomas M Dougherty
(74) Attorney, Agent, or Firm — NSIP Law

(57) ABSTRACT

A bulk acoustic wave filter device and method thereof includes a first layer forming an air gap together with a substrate, a lower electrode disposed over the first layer, a piezoelectric layer disposed to cover a portion of the lower electrode, an upper electrode disposed over the piezoelectric layer, a frame layer disposed below the upper electrode, and a lower electrode reinforcing layer disposed on the lower electrode, other than portions in which the piezoelectric layer is disposed. The lower electrode reinforcing layer is formed by separating the lower electrode reinforcing layer from the upper electrode or the frame layer upon one of the upper electrode and the frame layer being formed.

9 Claims, 5 Drawing Sheets

(51) Int. Cl.
*H01L 41/053* (2006.01)
*H01L 41/047* (2006.01)
*H03H 9/10* (2006.01)
*H03H 9/64* (2006.01)
*H03H 9/00* (2006.01)
*H01L 41/277* (2013.01)
*H03H 9/17* (2006.01)
*H03H 3/02* (2006.01)
*H01L 41/23* (2013.01)
*H01L 41/25* (2013.01)
*H03H 9/02* (2006.01)

(52) U.S. Cl.
CPC .............. *H03H 3/02* (2013.01); *H03H 9/009* (2013.01); *H03H 9/02118* (2013.01); *H03H 9/173* (2013.01); *H03H 9/64* (2013.01); *H03H 2003/021* (2013.01)

(58) Field of Classification Search
CPC ... H03H 2003/021; H01L 41/23; H01L 41/25; H01L 41/277
USPC .......................................... 310/348, 351, 365
See application file for complete search history.

(56) References Cited

U.S. PATENT DOCUMENTS

| | | | |
|---|---|---|---|
| 2012/0206015 A1* | 8/2012 | Choy | H03H 9/173 310/335 |
| 2015/0349747 A1* | 12/2015 | Burak | H03H 9/173 333/187 |
| 2017/0237408 A1* | 8/2017 | Han | H03H 9/54 310/349 |
| 2017/0244021 A1* | 8/2017 | Han | H01L 41/047 |
| 2018/0013397 A1* | 1/2018 | Lim | H03H 3/02 |
| 2018/0013401 A1* | 1/2018 | Lee | H03H 3/0077 |
| 2018/0019723 A1* | 1/2018 | Lim | H03H 9/02118 |

FOREIGN PATENT DOCUMENTS

| KR | 10-2005-0098056 A | 10/2005 |
|---|---|---|
| KR | 10-2006-0098056 A | 10/2005 |

* cited by examiner

BULK ACOUSTIC WAVE FILTER DEVICE AND METHOD FOR MANUFACTURING THE SAME

CROSS-REFERENCE TO RELATED APPLICATION(S)

This application claims the benefit under 35 USC 119(a) of Korean Patent Application Nos. 10-2016-0089387, filed on Jul. 14, 2016 and 10-2016-0159251, filed on Nov. 28, 2016 in the Korean Intellectual Property Office, the disclosure of which is incorporated herein by reference in their entirety.

BACKGROUND

1. Field

The following description relates to a bulk acoustic wave filter device and a method for manufacturing the same.

2. Description of Related Art

Currently, in accordance with the rapid development of communications technology, there is a demand for the development of a signal processing technology and a radio frequency (RF) component technology.

In particular, in accordance with a miniaturization trend for a wireless communications device, there is an active demand for a miniaturization of the radio frequency components. Miniaturization of a filter among radio frequency components has been implemented by manufacturing the filter as a bulk acoustic wave (BAW) resonator using a technology that manufactures a semiconductor thin film wafer.

The bulk acoustic wave (BAW) resonator implements a thin film type element where a piezoelectric dielectric material is deposited on a silicon wafer, which is a semiconductor substrate, to produce resonance by using piezoelectric characteristics of the piezoelectric dielectric material as the filter. Application fields of the bulk acoustic wave (BAW) resonator include small and light weight filters such as those used in mobile communications devices, chemical and bio devices, and other similar devices, an oscillator, a resonance element, and an acoustic resonance mass sensor.

Further, various structural shapes and functions to enhance functional and structural characteristics of the bulk acoustic wave resonator have been researched, and there is a need to develop a structure and a technique to reduce variation of the characteristics of the bulk acoustic wave resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a bulk acoustic wave filter device, including: a first layer forming an air gap together with a substrate; a lower electrode disposed over the first layer; a piezoelectric layer disposed to cover a portion of the lower electrode; an upper electrode disposed over the piezoelectric layer; a frame layer disposed below the upper electrode; and a lower electrode reinforcing layer disposed on the lower electrode, other than portions in which the piezoelectric layer may be disposed, wherein the lower electrode reinforcing layer may be formed by separating the lower electrode reinforcing layer from the upper electrode or the frame layer upon one of the upper electrode and the frame layer being formed.

The lower electrode reinforcing layer may be formed of the same material as the lower electrode or of a material comprising the same material.

The bulk acoustic wave filter device may further include: a second layer formed over the first layer covering the air gap.

The bulk acoustic wave filter device may further include: a third layer disposed to cover the first layer and the upper electrode, other than the lower electrode reinforcing layer and the upper electrode supporting a metal pad.

A metal pad may be formed on the lower electrode reinforcing layer and the upper electrode.

A thickness of the lower electrode reinforcing layer corresponds to a thickness of the upper electrode or the frame layer.

The lower electrode reinforcing layer may be disposed between portions of the frame layer, below a metal pad, and over the lower electrode.

The lower electrode reinforcing layer may be simultaneously formed with the upper electrode, and the upper electrode and the lower electrode reinforcing layer may be separated from each other through patterning.

The lower electrode reinforcing layer may be disposed on portions of the lower electrode other than in portions in which the piezoelectric layer and the frame layer may be disposed.

In accordance with an embodiment, there is provided a method to manufacture a bulk acoustic wave filter device, the method including: forming a surface layer to cover a lower electrode, a piezoelectric layer, a frame layer, and a first layer; and separating the surface layer into a lower electrode reinforcing layer and an upper electrode by etching, and removing the surface layer, other than portions in which the lower electrode reinforcing layer and the upper electrode may be disposed.

The lower electrode reinforcing layer may be formed of the same material as the lower electrode or of a material comprising the same material.

The method may further include: prior to the forming of the surface layer, forming a sacrificial layer on a substrate; forming the first layer on the substrate and the sacrificial layer to cover the sacrificial layer; forming a second layer on the first layer so as to be disposed over the sacrificial layer; and forming the lower electrode on the second layer so that a portion of the lower electrode may be disposed over the sacrificial layer.

The method may further include: subsequently to the forming of the lower electrode, forming the piezoelectric layer to cover the lower electrode, the second layer, and the first layer, and to be externally exposed; forming the frame layer on the piezoelectric layer; and removing a portion of the piezoelectric layer so that a portion of the lower electrode and a portion of the first layer may be externally exposed.

The method may further include: subsequently to the separating of the surface layer into the lower electrode reinforcing layer and the upper electrode, forming a third layer to externally expose portions of the lower electrode reinforcing layer and the upper electrode.

The forming of the third layer includes: forming the third layer to cover the lower electrode reinforcing layer, the upper electrode, and the second layer, and to be externally exposed; and removing a portion of the third layer by etching to externally expose the portions of the lower electrode reinforcing layer and the upper electrode.

The method may further include: forming a metal pad on the lower electrode reinforcing layer and the upper electrode, to be externally exposed.

The method may further include: prior to the forming of the metal pad, removing an oxide material from surfaces of the lower electrode reinforcing layer and the upper electrode.

The method may further include: subsequently to the forming of the metal pad, forming an air gap by removing the sacrificial layer formed on the substrate.

In accordance with an embodiment, there is provided a method to manufacture a bulk acoustic wave filter device, the method including: forming a surface layer to cover a lower electrode, a piezoelectric layer, an upper electrode, and a first layer, wherein the surface layer may be externally exposed; and separating the surface layer into a lower electrode reinforcing layer and a frame layer by etching and removing the surface layer, other than portions in which the lower electrode reinforcing layer and the frame layer may be disposed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
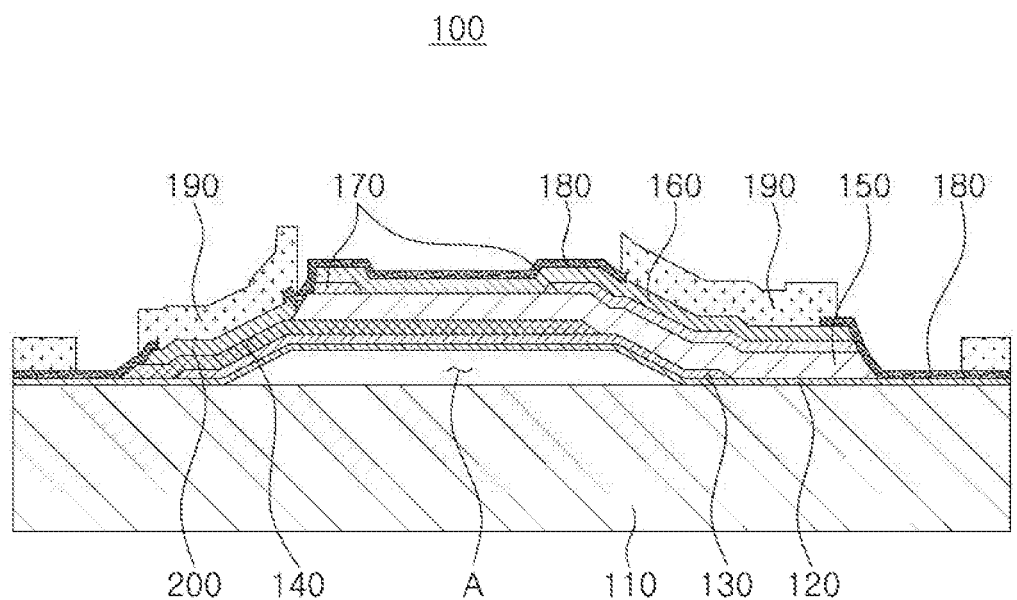
FIG. 1 is a schematic cross-sectional view illustrating a bulk acoustic wave filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view illustrating a bulk acoustic wave filter device, according to an embodiment.

Referring to FIG. 1, a bulk acoustic wave filter device 100, according to an embodiment, includes a substrate 110, a first layer 120, a second layer 130, a lower electrode 140, a piezoelectric layer 150, an upper electrode 160, a frame layer 170, a third layer 180, a metal pad 190, and a lower electrode reinforcing layer 200.

The substrate 110 is a substrate on silicon that is stacked. For example, a silicon wafer may be used as the substrate. Also, a protection layer (not shown) to protect the silicon may be formed on a top surface of the substrate 110. That is, the protection layer may be formed on the top surface of the substrate 110 to prevent etching of the substrate 110 when the operation of removing a sacrificial layer 210, to be described below, is performed.

The first layer 120 is formed or disposed on the substrate 110 and an air gap A. That is, the first layer 120 may be formed on the substrate 110 and a sacrificial layer 210 so as to cover the sacrificial layer 210, to be described below, formed on the substrate 110. Thereafter, once the sacrificial layer 210 is removed, the air gap A is formed below the first layer 120 and above the substrate 110. For purposes of description, the term disposed will be used to describe the formation and disposition of the various layers and elements described in the present description.

As an example, the first layer 120 is formed of silicon oxide ($SiO_2$) or a material containing silicon oxide ($SiO_2$). The first layer 120 may also serve to prevent etching of a lower end portion of the resonating part when an operation of removing the sacrificial layer 210 is performed.

In an example, each resonating part is a configuration of the bulk acoustic wave filter device 100 that deforms and vibrates together with a piezoelectric layer 150, as the piezoelectric layer 150, to be described below, deforms.

The second layer 130 is formed on the first layer 120, and covers the air gap A. In addition, the second layer 130 may be formed of silicon nitride (SiN) or a material containing silicon nitride (SiN).

Further, the second layer 130, together with the first layer 120, serve to compensate for stress caused by the resonating part and serve to reduce deformation of the structure of the resonating part, in which the first layer 120 and the substrate 110 are bonded in the region in which the air gap A is formed, or reduce a distortion between the resonating part and an adjacent region of the resonating part.

The lower electrode 140 is formed on the second layer 130. As an example, the lower electrode 140 is made of a conductive material such as molybdenum (Mo), ruthenium (Ru), tungsten (W), iridium (Ir), platinum (Pt), or an alloy thereof.

In addition, the lower electrode 140 may be used as either an input electrode, which receives an electric signal, such as a radio frequency (RF) signal, or may be used an output electrode. In an example in which the lower electrode 140 is the input electrode, the upper electrode 160 is the output electrode. In another example in which the lower electrode 140 is the output electrode, the upper electrode 160 is the input electrode and receives the electrical signal.

In one configuration, the piezoelectric layer 150 covers at least a portion of the lower electrode 140 and a portion of the second layer 130. In addition, the piezoelectric layer 150 converts the electric signal received at the lower electrode 140 or the upper electrode 160 into an acoustic wave.

As an example, in response to an electric field that changes over time is maintained in the upper electrode 160, the piezoelectric layer 150 converts the electric signal input from the upper electrode 160 into physical vibration. In addition, the piezoelectric layer 150 converts the converted physical vibration into an acoustic wave. In this case, the electric field that changes over time may be induced. As a result, the piezoelectric layer 150 generates a bulk acoustic wave in the same direction as a thickness vibration direction within the piezoelectric layer 150 oriented using the induced electric field.

As such, the piezoelectric layer 150 generates the bulk acoustic wave to convert the electric signal into the acoustic wave.

In this example, the piezoelectric layer 150 is formed by depositing aluminum nitride, zinc oxide, or lead zironate titanate on the lower electrode 140. When the piezoelectric layer 150 is made of aluminum nitride (AlN), the piezoelectric layer 150 may further include a rare earth metal. For example, the rare earth metal may include at least one of scandium (Sc), erbium (Er), yttrium (Y), and lanthanum (La).

The upper electrode 160 is formed to cover the frame layer 170, and is formed of a conductive material such as molybdenum (Mo), ruthenium (Ru), tungsten (W), iridium (Ir), platinum (Pt), and the like, or an alloy thereof, by way of example. In addition, the upper electrode 160 may be used as either an input electrode that receives an electric signal such as a radio frequency (RF) signal, or an output electrode that outputs the RF signal, as described above.

The frame layer 170 is disposed on the piezoelectric layer 150. As an example, the frame layer 170 is disposed below the upper electrode 160 and is disposed on various portions of the piezoelectric layer 150, other than a central portion of the piezoelectric layer 150. Further, the frame layer 170 may be made of the same material as the upper electrode 160. However, the material of the frame layer 170 is not limited thereto, and the frame layer 170 may be made of a material different from the upper electrode 160.

The frame layer 170 reflects a lateral wave generated at a time of resonating into an active region to confine resonant energy in the active region.

The third layer 180 is formed to cover the upper electrode 160, other than a portion of the upper electrode 160 in which the metal pad 190 is formed. The third layer 180 is disposed over the first layer 120, covering at least a side portion of the lower electrode 140, at least a portion of a side of the piezoelectric layer 150, an entire side portion of the frame layer 170, at least a side portion of the upper electrode 180, at least a portion of another side of the frame layer 170 In one example, the third layer 180 protects the frame layer 170 and the upper electrode 160 from being damaged during an operation. Further, a thickness of the third layer 180 may be adjusted by etching, to adjust a frequency in a final operation.

In addition, the third layer 180 may also be disposed on all other regions except the region on which the metal pad 210 is disposed.

The metal pad 190 is electrically connected to the lower electrode 140 and the upper electrode 160.

The lower electrode enforcing layer 200 is formed on the remaining portions of the lower electrode 140, other than portions on which the piezoelectric layer 150, and may be disposed by separating the lower electrode enforcing layer 200 from the upper electrode 160 when the upper electrode 160 is formed.

Also, the lower electrode reinforcing layer 200 may be formed of the same material as the lower electrode 140.

Further, the lower electrode reinforcing layer 200 has a thickness corresponding to a thickness of the upper electrode 160.

A method to form the lower electrode reinforcing layer 200 will be described below in detail.

As described, because the lower electrode reinforcing layer 200 is formed on the lower electrode 140, loss of the lower electrode 140 is prevented even upon the lower electrode reinforcing layer 200 being lost in a subsequent process.

Accordingly, the bulk acoustic wave filter device is an improved filter device so that electrical characteristics thereof are not influenced.

According to a conventional configurations, in order to connect the lower electrode 140 to the metal pad 190, a plurality of layers disposed on the lower electrode 140 need to be removed by etching, to expose the lower electrode 140 to the outside.

At this time, firstly, the piezoelectric layer 150 may be etched, but the lower electrode 150 may be damaged when the piezoelectric layer 150 is etched. Next, secondly, the protection layer may be etched, but, at this time, the lower electrode 140 may also be damaged. In addition, in order to deposit the metal pad 190, an oxide material needs to be removed from some regions of the upper and lower electrodes 140 and 160 on which the metal pad 190 is formed. When the etching performed to remove the oxide material is performed, the lower electrode 140, again, may be damaged.

As such, in a case in which the thickness of the lower electrode 140 is decreased by the damage of the lower electrode 140, it may adversely influence the electrical characteristics, such as an increase in a resistance value, and the like.

However, because the lower electrode reinforcing layer 200 is formed as described above, the loss of the lower electrode 140 is prevented even if the lower electrode reinforcing layer 200 is lost or removed. As a result, deterioration in the electrical characteristics may be prevented.

Hereinafter, a method to manufacture a bulk acoustic wave filter device, according to an embodiment will be described, with reference to the drawings.

FIGS. 2 through 9 are process views illustrating a method to manufacture a bulk acoustic wave filter device, according to an embodiment.

Figure 2:
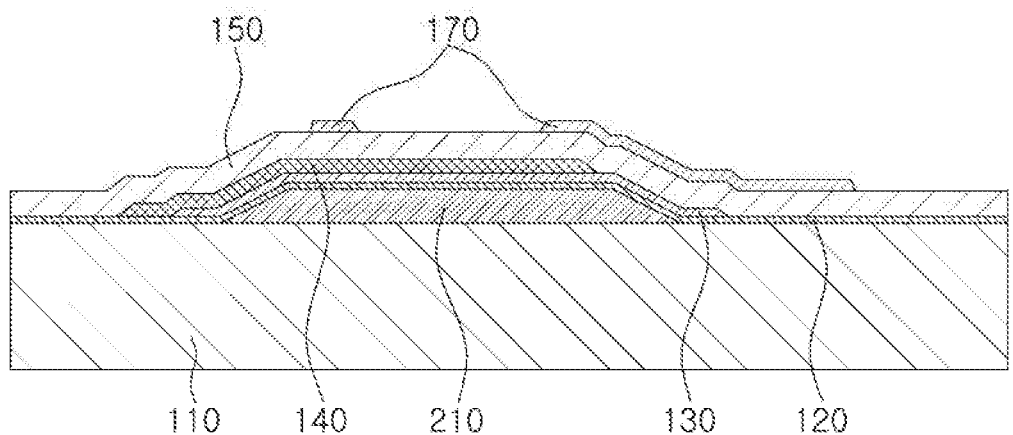
FIGS. 2 through 9 are process views illustrating a method to manufacture a bulk acoustic wave filter device, according to an embodiment.

First, as illustrated in FIG. 2, the sacrificial layer 210, the first layer 120, the second layer 130, the lower electrode 140, the piezoelectric layer 150, and the frame layer 170 are sequentially formed on the substrate 110.

That is, the sacrificial layer 210 is formed on the substrate 110, and the first layer 120 is then formed to cover the sacrificial layer 210 and the remaining regions of the substrate 110. Further, the first layer 120 may be formed of silicon oxide (SiO$_2$) or a material containing silicon oxide (SiO$_2$).

Next, the second layer 130 is formed on the first layer 120 to cover the sacrificial layer 210. Although the embodiment, by way of example, describes an example in which the second layer 130 is formed to cover only the sacrificial layer 210, the second layer 130 is not limited thereto, and may be extended to cover the first layer 120 disposed outside of the sacrificial layer and simultaneously disposed to cover the sacrificial layer 210. In addition, the second layer 130 may be formed of silicon nitride (SiN) or a material containing silicon nitride (SiN).

Next, the lower electrode 140 is formed on the second layer 130. The lower electrode 140 may be formed of a conductive material such as molybdenum (Mo), ruthenium (Ru), tungsten (W), iridium (Ir), platinum (Pt), and the like, or an alloy thereof. In addition, at least a portion of the lower electrode 140 is disposed on the sacrificial layer 210.

Next, the piezoelectric layer 150 is formed. The piezoelectric layer 150 is formed to cover the lower electrode 140, the second layer 130, and the first layer 120, exposed externally. The piezoelectric layer 150 may be formed by depositing aluminum nitride, zinc oxide, or lead zironate titanate.

Next, the frame layer 170 is formed on the piezoelectric layer 150. Also, the frame layer 170 is formed so that the piezoelectric layer 150 is exposed in a region disposed to cover the sacrificial layer 210.

Figure 3:
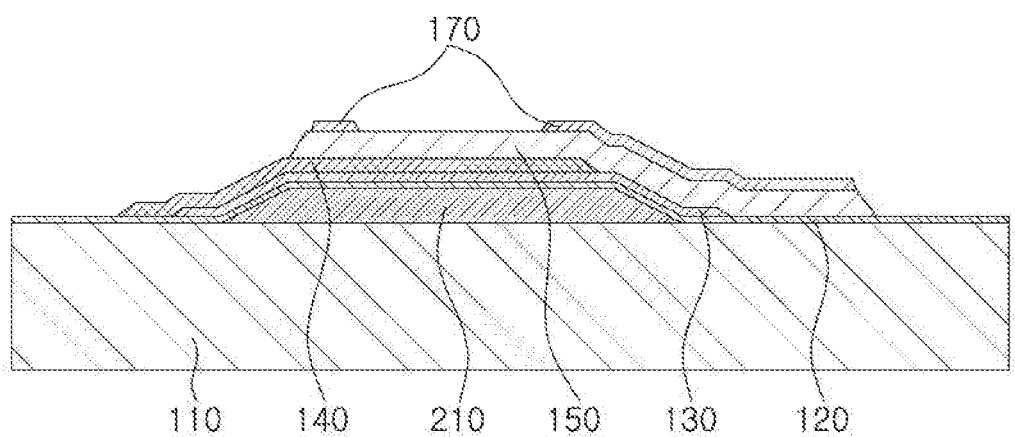

Next, as illustrated in FIG. 3, a portion of the piezoelectric layer 150 is removed. In this case, the piezoelectric layer 150 is removed so that a portion of the lower electrode 140 and a portion of the first layer 120 are exposed externally. That is, the piezoelectric layer 150 is removed so that the portion of the lower electrode 140 and the first layer 120, disposed on an outer region of the resonating part, are exposed externally.

Figure 4:
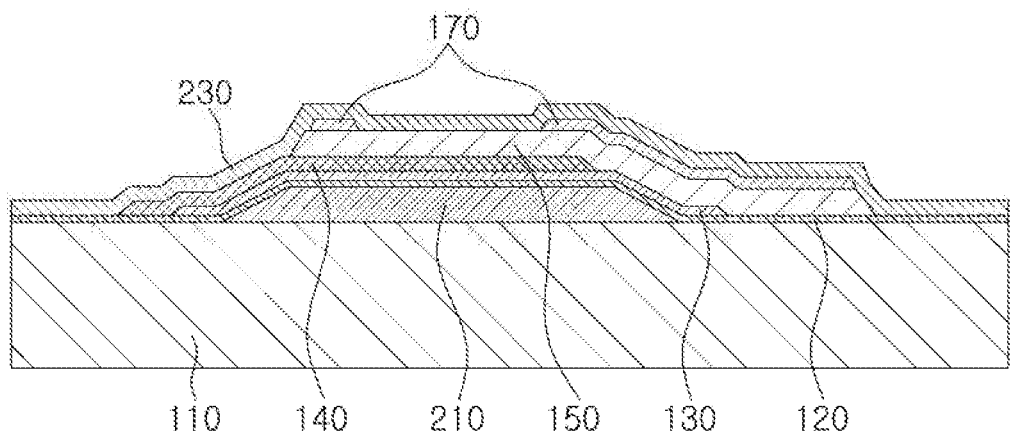

Next, as illustrated in FIG. 4, a fourth layer or a surface layer 230 is formed. The fourth layer 230 is formed to cover the lower electrode 140, the piezoelectric layer 150, the frame layer 170, and the first layer 120, exposed externally.

The fourth layer 230 may be formed of a conductive material such as molybdenum (Mo), ruthenium (Ru), tungsten (W), iridium (Ir), platinum (Pt), and the like, or an alloy thereof. In other words, the fourth layer 230 may be formed of the same material as the lower electrode 140 or of a material containing the same material.

Figure 5:
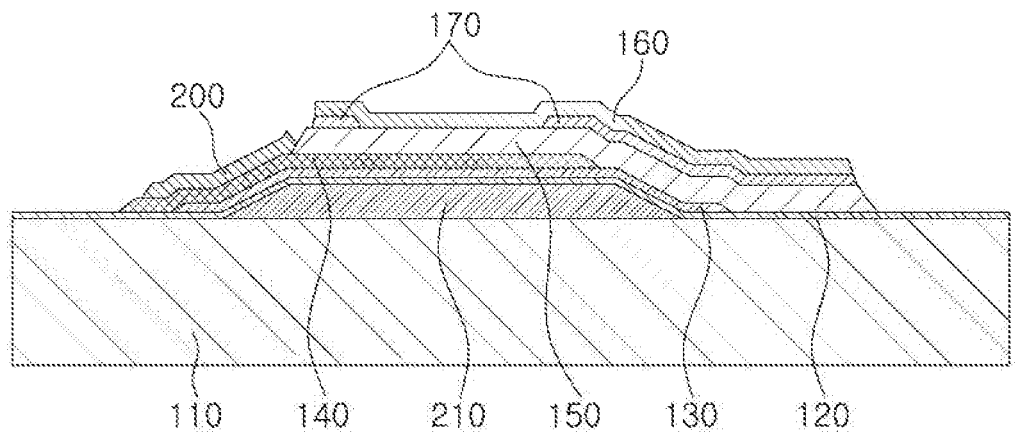

Next, as illustrated in FIG. 5, the fourth layer 230 is separated into the lower electrode reinforcing layer 200 and the upper electrode 160 by etching, and the remaining portions, except for the lower electrode reinforcing layer 200 and the upper electrode 160, are removed.

Figure 6:
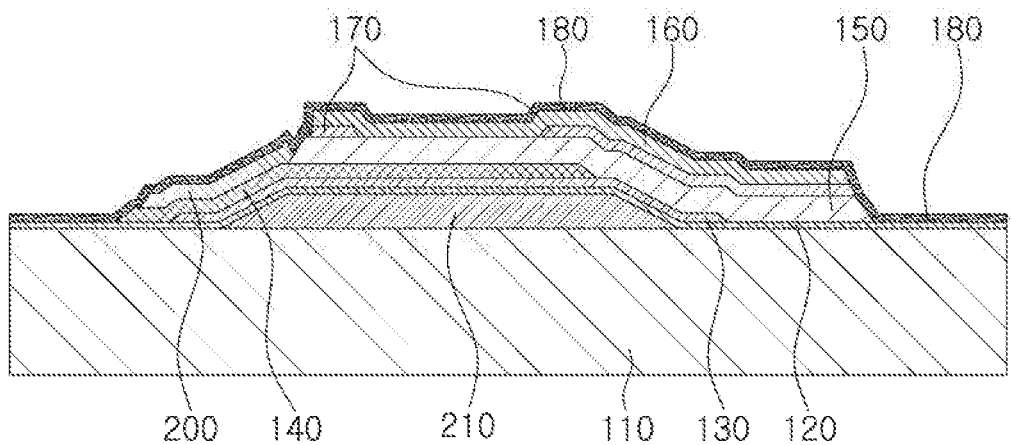

Next, as illustrated in FIG. 6, the third layer 180 is formed. The third layer 180 is formed to cover the lower electrode reinforcing layer 200, the upper electrode 160, and the second layer 130, externally exposed.

Figure 7:
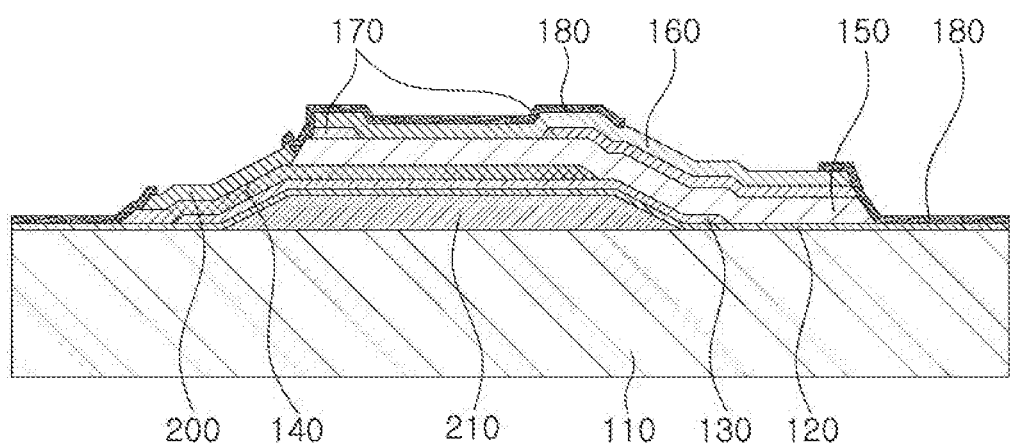

Next, as illustrated in FIG. 7, a portion of the third layer 180 is removed by etching, so that portions of the lower electrode reinforcing layer 200 and the upper electrode 160 are externally exposed.

Figure 8:
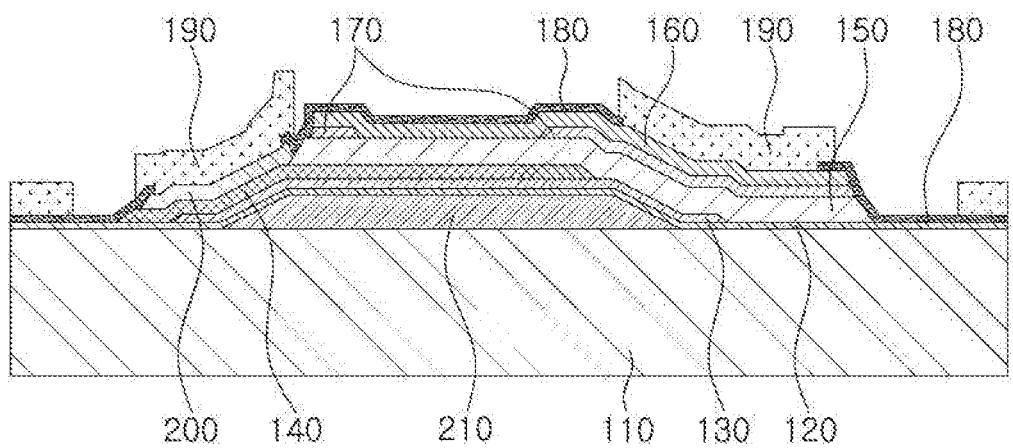

Subsequently, as illustrated in FIG. 8, the metal pad 190 is formed on the lower electrode reinforcing layer 200 and the upper electrode 160, which are externally exposed. Prior to forming the metal pad 190, an oxide material that exists on surfaces of the lower electrode reinforcing layer 200 and the upper electrode 160 that are exposed externally are removed. In this example, the lower electrode reinforcing layer 200 and the upper electrode 160 may be lost.

Figure 9:
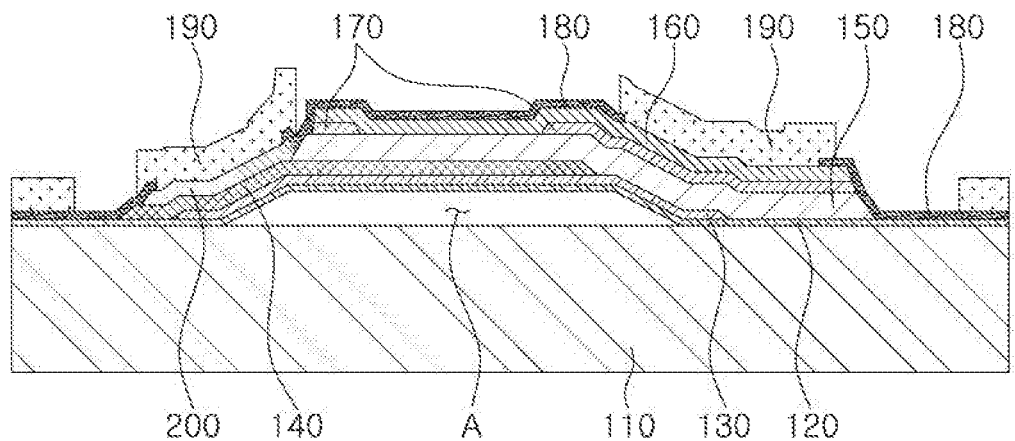

Then, as illustrated in FIG. 9, the sacrificial layer 210 is removed to form the air gap A between the substrate 110 and the first layer 120.

As described above, the lower electrode 140 is reinforced by changing the conventional process sequence, without an additional process and an increase in a thickness of the entire lower electrode. That is, unlike the conventional process sequence, the upper electrode 160 is formed after patterning the frame layer 170 and the piezoelectric layer 150. Accordingly, the lower electrode reinforcing layer 200 is simultaneously formed with the upper electrode 160, and the upper electrode 160 and the lower electrode reinforcing layer 200 are then separated from each other through patterning.

As a result, the lower electrode reinforcing layer 200 is formed without adding an additional process or without increasing the thickness of the lower electrode 140.

Hereinafter, a bulk acoustic wave filter device, according to another embodiment will be described, with reference to the drawings. Meanwhile, the same components as the above-mentioned components will be denoted by the same reference numerals and a detailed description thereof will be omitted.

Figure 10:
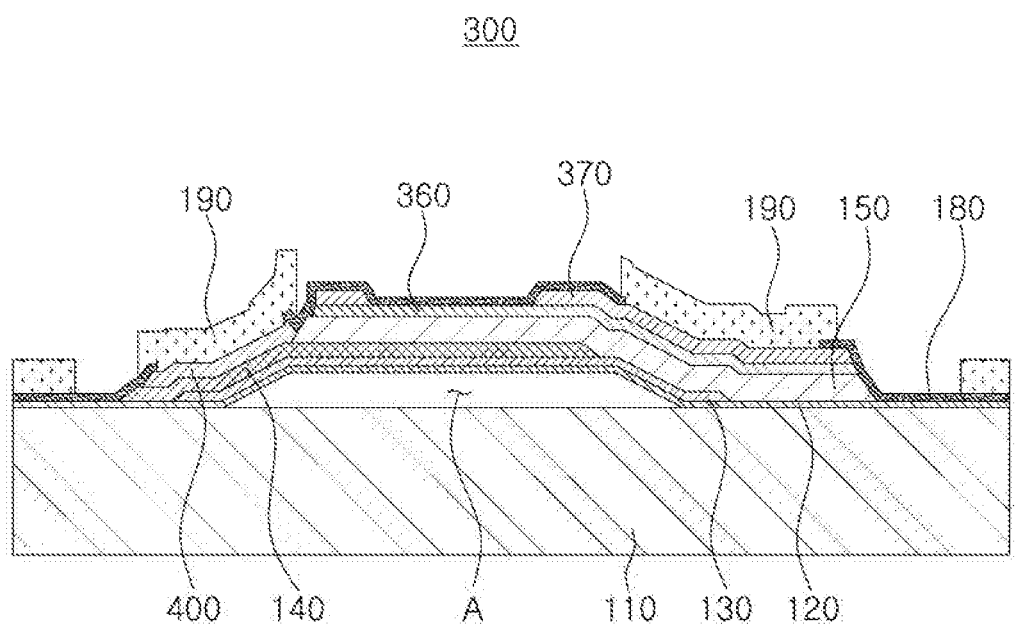
FIG. 10 is a schematic cross-sectional view illustrating a bulk acoustic wave filter device, according to an embodiment.

FIG. 10 is a schematic cross-sectional view illustrating a bulk acoustic wave filter device, according to another embodiment.

Referring to FIG. 10, a bulk acoustic wave filter device 300, according to another embodiment, includes a substrate 110, a first layer 120, a second layer 130, a lower electrode 140, a piezoelectric layer 150, an upper electrode 360, a frame layer 370, a third layer 180, a metal pad 190, and a lower electrode reinforcing layer 400.

Further, the bulk acoustic wave filter device 300, according to an embodiment, is different from the bulk acoustic wave filter device 100 described above (for instance, FIG. 1) in that a sequence of stacking the upper electrode 360 and the frame layer 370 is different, and the lower electrode reinforcing layer 400 is formed by separating it from the frame layer 370 when the frame layer 370 is formed.

In other words, the upper electrode 360 is formed on the piezoelectric layer 150 to cover the piezoelectric layer 150, and the frame layer 370 is then formed to cover the upper electrode 360 and the lower electrode 140. Next, the lower electrode reinforcing layer 400 is separated from the frame layer 370 so that the lower electrode reinforcing layer 400 is formed, and a portion of the frame layer 370 is removed so that a portion of the upper electrode 360 is exposed.

Meanwhile, the frame layer 370 is formed of the same material as the lower electrode 140 or of a material containing the same material.

As described, because the lower electrode reinforcing layer 400 is formed on the lower electrode 140, loss of the lower electrode 140 is prevented, even if the lower electrode reinforcing layer 400 is lost in a subsequent process.

Accordingly, the bulk acoustic wave filter device is improved so that electrical characteristics thereof are not influenced.

As set forth above, according to the various embodiments, electrical characteristics of the bulk acoustic wave filter device are improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave filter device, comprising:
    a first layer forming an air gap together with a substrate;
    a lower electrode disposed over the first layer;
    a piezoelectric layer disposed to cover a portion of the lower electrode;
    an upper electrode disposed over the piezoelectric layer;
    a frame layer disposed below the upper electrode; and
    a lower electrode reinforcing layer disposed on the lower electrode, other than portions in which the piezoelectric layer is disposed,
    wherein the lower electrode reinforcing layer is formed by separating the lower electrode reinforcing layer from the upper electrode or the frame layer upon one of the upper electrode and the frame layer being formed.

2. The bulk acoustic wave filter device of claim 1, wherein the lower electrode reinforcing layer is formed of the same material as the lower electrode or of a material comprising the same material.

3. The bulk acoustic wave filter device of claim 1, further comprising:
    a second layer formed over the first layer covering the air gap.

4. The bulk acoustic wave filter device of claim 1, further comprising:
    a third layer disposed to cover the first layer and the upper electrode, other than the lower electrode reinforcing layer and the upper electrode supporting a metal pad.

5. The bulk acoustic wave filter device of claim 1, wherein a metal pad is formed on the lower electrode reinforcing layer and the upper electrode.

6. The bulk acoustic wave filter device of claim 1, wherein a thickness of the lower electrode reinforcing layer corresponds to a thickness of the upper electrode or the frame layer.

7. The bulk acoustic wave filter device of claim 1, wherein the lower electrode reinforcing layer is disposed between portions of the frame layer, below a metal pad, and over the lower electrode.

8. The bulk acoustic wave filter device of claim 1, wherein the lower electrode reinforcing layer is simultaneously formed with the upper electrode, and the upper electrode and the lower electrode reinforcing layer are separated from each other through patterning.

9. The bulk acoustic wave filter device of claim 1, wherein the lower electrode reinforcing layer is disposed on portions of the lower electrode other than in portions in which the piezoelectric layer and the frame layer are disposed.

* * * * *